United States Patent [19]
Nelson et al.

[11] Patent Number: 5,376,909
[45] Date of Patent: Dec. 27, 1994

[54] DEVICE PACKAGING

[75] Inventors: Stephen R. Nelson; Buford H. Carter, Jr., both of Richardson; Tammy J. Lahutsky; Glen R. Haas, both of Plano; Dennis D. Davis, Garland, all of Tex.; Charles W. Suckling, Rushden; Glenn Collinson, Hitchin, both of England

[73] Assignee: Texas Instruments Incorporated, Dallas, Tex.

[21] Appl. No.: 65,691

[22] Filed: May 21, 1993

Related U.S. Application Data

[63] Continuation of Ser. No. 890,900, May 29, 1992, abandoned.

[51] Int. Cl.⁵ ............................................. H01L 23/28
[52] U.S. Cl. .................................. 333/247; 257/692; 257/728; 257/664; 257/675; 333/33
[58] Field of Search .................. 333/1, 33, 238, 246, 333/247; 357/74; 330/65, 66; 257/691, 692, 728, 664, 666, 675; 361/421; 174/52.2

[56] References Cited

U.S. PATENT DOCUMENTS

| | | | |
|---|---|---|---|
| 3,936,778 | 2/1976 | De Ronde | 333/246 |
| 3,958,195 | 5/1976 | Johnson | 333/247 |
| 4,713,634 | 12/1987 | Yamamura | 333/247 X |
| 4,725,878 | 2/1988 | Miyauchi et al. | 357/74 X |
| 4,791,473 | 12/1988 | Phy | 257/728 X |
| 4,839,717 | 6/1989 | Phy et al. | 357/74 |
| 4,875,087 | 10/1989 | Miyauchi et al. | 357/74 X |
| 4,982,268 | 1/1991 | Schuermann | 357/70 |
| 4,991,001 | 2/1991 | Takubo et al. | 257/672 X |
| 5,028,741 | 7/1991 | Sanders et al. | 174/52.2 |
| 5,057,805 | 10/1991 | Kadowaki | 333/247 |
| 5,087,530 | 2/1992 | Wada et al. | 361/421 X |
| 5,193,053 | 3/1993 | Sonobe | 257/675 X |
| 5,218,230 | 6/1993 | Tamamura et al. | 257/691 |
| 5,245,216 | 9/1993 | Sako | 257/691 X |
| 5,319,242 | 6/1994 | Carney et al. | 257/675 X |

Primary Examiner—Paul Gensler
Attorney, Agent, or Firm—Dana L. Burton; Richard A. Stoltz; James C. Kestersom

[57] ABSTRACT

This is a package [10] for an rf device [11] operable with a characteristic impedance providing a plurality of terminals [12-19] and [101] for effecting circuit connections to the device, the connection between at least one of the terminals and the device being matched in relation to the characteristic impedance. Other devices and methods are also disclosed.

20 Claims, 3 Drawing Sheets

DEVICE PACKAGING

This application is a continuation of application Ser. No. 07/890,900, filed May 29, 1992, now abandoned.

FIELD OF THE INVENTION

This invention generally relates to device packaging.

BACKGROUND OF THE INVENTION

A radio-frequency device is one which operates in an environment wherein a characteristic impedance or desired transfer impedance may be identified or specified. Such device might be a discrete transistor in an amplifier circuit, such as for example a field-effect transistor or an integrated unit providing rf amplifier functionality or contributing to such functionality. Devices may operate for example at very high, ultra-high microwave or gigahertz band frequencies. Typical applications would be in the communication area, such as for example transmitter amplifiers, receiver front ends and intermediate frequency stages. Circuits for providing such functionality may for example be based upon FETs, e.g. Gallium Arsenic devices or bipolar transistors, such as heterojunction bipolar transistors.

A package for an rf device is required to provide protection to the device, for example environmental protection for a semiconductor providing an integrated circuit. Equally, a package may provide a degree of integration for example of a semiconductor die or dies and wire components into a single device realizing an amplifier. Such a package also provides terminals for electrical connections to the device itself so that circuits incorporating the device may be realized. Typically, conductive pins are provided which extend beyond the package to be connected into a circuit, for example by soldering to printed circuit board. Within the package terminal extensions which lead towards the device are eventually terminated proximate the device, the final connection being effected by, for example gold wire bonds between bond pads of a semiconductor device and the interior termination sites of the terminal extensions.

A technique for providing such terminals that is adapted for automated production involves providing terminals and their extension as fingers on a carrier portion which is eventually discarded, the whole being known in the art as a lead frame. In production the lead frame is held proximate a semiconductor die, for example so that gold wire bonds may be effected. Therebetween the die and the finger portion of the lead frame is then encapsulated to form a packaged device. The carrier portion of the lead frame may then be separated leaving the connected finger portion extending from package interior to exterior so forming the designed terminals. Use of lead frames has become widely adopted inter alia because it will be apparent that the lead frame prior to separation of the carrier portion may be used to assist work piece support and handling during production.

Many devices generate considerable heat in use and it is well known that such heat must be sunk away to preserve device operating characteristics, device reliability and to prevent damage. To this end, it is known to incorporate a heatsink member within a package for a device. Typically a heatsink might comprise a heat conductive and receptive member being exposed within a package and in thermal contact with a device such that it may be radiated by and/or conducted or convected away from the heatsink. Such heatsink might also be in thermal contact with device terminals or terminal extensions. In some arrangements, it may be appropriate to provide a path or fixing to a terminal or terminal extension, particularly in the case of a lead frame such a fixture may be beneficial since, in addition to providing for example, electrical contact (such as in the case of an rf design requiring a proximate ground plane), thermal contact (such as to aid heat sinking) may be provided. Typically, a fixing would comprise a rivet, for example a rivet formed by protrusion of a rivet shank through a heatsink and a lead frame finger with subsequent formation of a rivet head. It will be appreciated that such fixings enhance lead frame support during production.

When a device package is considered perhaps the most noticeable feature is the encapsulant, since it provides the bulk of externally visible structure. Encapsulants have been developed which can be applied at very low cost and are used to package many commercially available ics such transistor-transistor logic, microprocessors and dynamic or static random access memories. Since many packaged devices are non-rf devices wherein the electrical properties of the encapsulant show little or considerably reduced likelihood of impairing device electrical characteristics appreciably, a diversity of low cost encapsulants and packages have been developed. It will be appreciated that packaging/device cost is the predominant motivator of such development, a package often being commercially accepted with no more than minimal electrical properties.

In rf applications, however, poor electro-magnetic performance can seldom be tolerated and indeed to this end comparatively expensive packaging techniques are presently in use. Ceramic packages (good di-electric properties) and even shielded (metal clad device) packages are presently in use in rf applications. Unfortunately, the expense associated with such techniques implies costs which might limit the progress of otherwise viable technologies.

For example, viability of public cordless telephony might be considered to depend upon availability of a low cost rf amplifier, such that a generally affordable telephone transmitter/receiver handset might be realized. These considerations go beyond low cost packaging considerations, however since a cordless environment is unable viably to tolerate high inefficiency in spite of low cost due to, for example, limited energy storage capacity (e.g. battery life) and limited heatsinking capability (i.e. portable equipment).

It is against such background that the present invention has been made, although it will be apparent that the scope of the invention extends significantly therebeyond.

SUMMARY OF THE INVENTION

It is herein recognized that a need exists for a low-cost rf packaging method. Specifically, it is desired to improve the circuit efficiency while maintaining low-cost. The present invention is directed toward meeting those needs.

Generally, and in one form of the invention, a package for an rf device, operable with a characteristic impedance providing a plurality of terminals for effecting circuit connections to the device, the connection between at least one of the terminals and the device being matched in relation to the characteristic impedance, is presented. Preferably, the matching is achieved by virtue of co-operation between a ground plane and the connection, and may be achieved by virtue of co-operation between encapsulant and the ground plane. The di-electric constant of the encapsulant may vary along the length of at least one connection; at least a portion of at least one connection may run in encapsulant void; and the encapsulant may be plastic. Preferably, the co-operation takes the form of control of connection width to spacing ratio; the ground plane is a heatsink for the device; and the ground plane and at least one connection combine to form an overall package ground. The ground plane may extend towards package extremity in the region where at least one connection exits the package; one or more connections may be shimmed and the shimming may be done by virtue of tape; the connection may vary in width in the region of the extension; and the extension may provide stress relief. The connection may be realized as a transmission line. Preferably, the terminals are adapted for surface mounting; the rf terminals are configured for maximum isolation; and a ground terminal is placed intermediate rf terminals for shielding. The package may have a painted or other external shield. Preferably, at least one of the connections is terminated close to the device, to be connected thereto by wire and any mismatch due to the wire connection is compensated therein. One or more of the connections may include a portion of multiple plato transmission line. At least a portion of at least one connection may be pre-fabricated transmission line. One or more of the connections may bend along its length to enhance mechanical strength thereof.

In another form of the invention, a packaged rf device, operable with a charactoristic impedance providing a plurality of terminals for effecting circuit connections to the device, the connection between at least one of the terminals and the device being matched in relation to the charactoristic impedance, is presented. Preferably, the device is an amplifier; the amplifier includes GaAs heterojunction bipolar transistors; the device is a portion of a communication system and more specifically the device is a portion of a cordless phone. The device may also be a portion of a printed circuit board where any mismatch due to terminal adaption is compensated by board layout.

In yet another form of the invention a leadframe for a package, wherein width of at least one finger is adapted to cooperate with a ground plane such that a characteristic impedance is established in a conductive path provided by the finger, is presented.

BRIEF DESCRIPTION OF THE DRAWINGS

In order that features and advantages of the present invention may be further appreciated, embodiments will now be described by way of example only and with reference to the accompanying diagrammatic drawing figures of which.

DETAILED DESCRIPTION OF PREFERRED EMBODIMENTS

Figure 1:
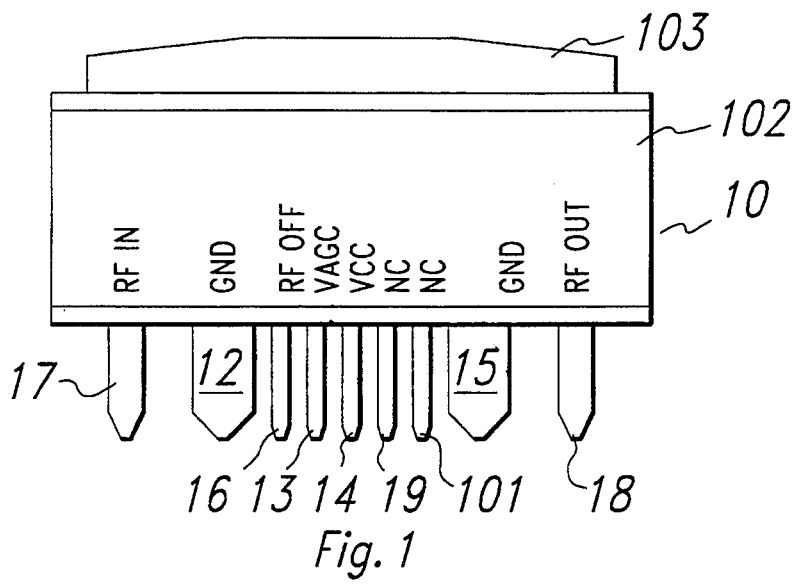
FIG. 1 represents a plan view of a packaged device.

Referring to FIG. 1, a package 10 for an rf device 11 (not shown in FIG. 1), an amplifier as an example, includes terminals 12 and 15 providing device ground connections, a voltage gain control terminal 13, a terminal 14 providing a device positive power supply connection, a terminal 16 providing an amplifier power compensation connection, a terminal 17 providing an rf input connection and a terminal 18 providing an rf output connection. Additionally, unconnected terminals 19 and 101 are provided. A di-electric encapsulant portion 102 provides the external bulk of the packaged device, while a heatsink 103 completes the package.

Figure 2:
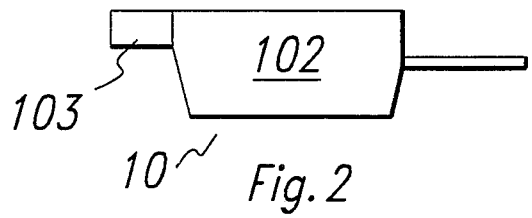
FIG. 2 represents a side view of a packaged device.

The packaged device is represented in an end view in FIG. 2.

In rf circuits, efficiency is generally improved if between one circuit element or stage and another a characteristic or preferred impedance can be preserved; in other words, for efficiency, stages should be matched in this sense at least. For example, for circuit stages in cordless telephony a characteristic impedance of 50 ohms might be specified to ensure efficient matching between stages. Essentially, efficiency is preserved only if matching is achieved between all signal path circuit nodes. This is true regardless of whether such a node is within or without a packaged device. The unmatched or mismatched condition leads to efficiency loss and for a packaged device an increase in the heat generated therein. Unfortunately, mismatch with respect to a package device must often be tolerated (in the case, for example, where low device cost is paramount extensive use of matching networks external to the packaged device may be incorporated in a final design) or ameliorated (in the case, for example, where matching components are included within the package of an otherwise unmatched device). An example of the former would be a "low cost" cordless telephone integrated circuit GaAs FET based amplifier circuit wherein the device user is required to perform matching in design. An example of the latter would be a multiple die integrated amplifier, or a single die plus circuit board device, the complexity being due to matching networks being realized within the packaged device.

Such a packaged device may for example be mounted in circuit in a recess in a printed circuit board with the terminals soldered flat, or alternatively inserted into through holes with perhaps the heatsink 103 mounted thermally to contact a further heatsinking surface.

Figure 3:
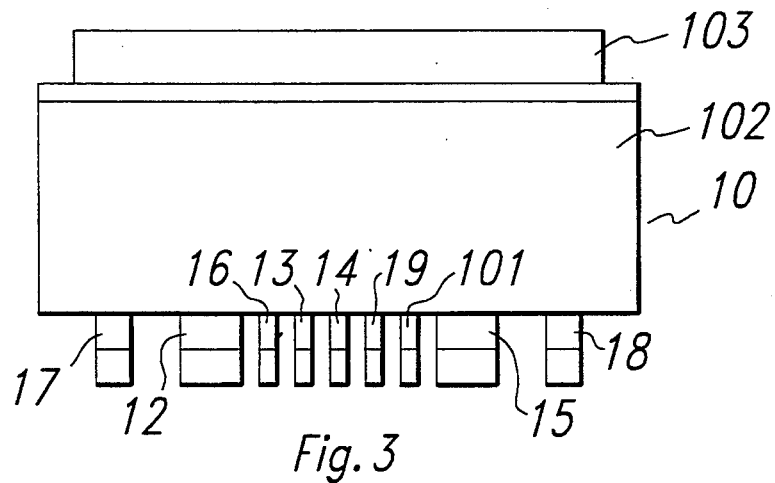
FIG. 3 represents a plan view of an alternative embodiment packaged device.
Figure 4:
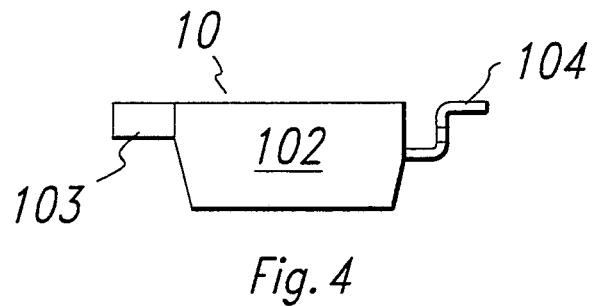
FIG. 4 represents a side view of an alternative embodiment packaged device.

In an alternative embodiment of the present invention (FIG. 3), terminals 12–19 and 101 may be fashioned to provide a surface 104 (FIG. 4) which is solderable in accordance with surface mount component technology. Such a package could be referred to as a "gull-wing" package. In some cases the "gull-wing" package may radiate more, but this will be within the magnitude of what may be tuned out in pcb design; expensive tuning components are not required.

From an internal view (FIG. 5) of a packaged device in accordance with the present invention, the internal extension of the terminals may be appreciated. Rf offset terminal 16 for example extends to the package interior to terminate at a terminal 51 which is wire bond connected to a bond pad 52 of a semiconductor die 11. Voltage gain control terminal 13 is likewise connected as is power supply terminal 14 similarly, except that the latter is directly connected to a further die 54 which provides supply smoothing capacity (that is capacitors realized in accordance with integrated circuit techniques) which (as may be seen from the subject figure) is inwardly connected via wire bonds, bonds 55 for example, to the semiconductor die 11.

Figure 5:
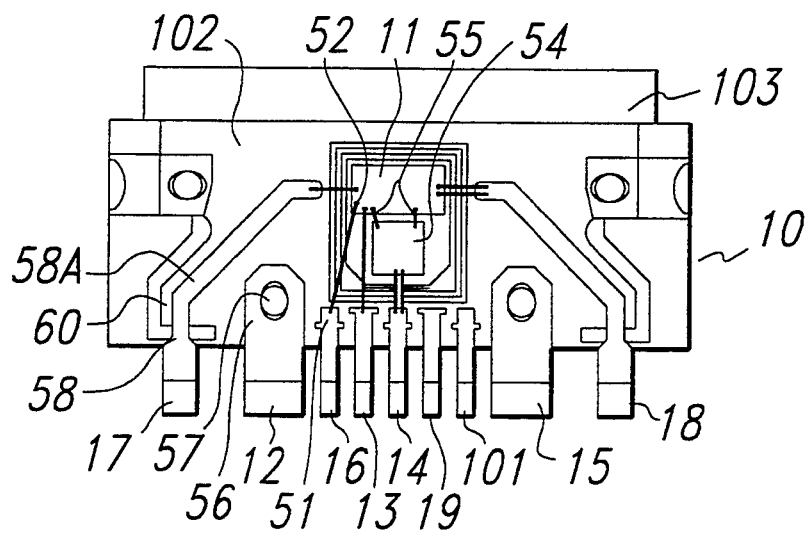
FIG. 5 represents an internal view of a packaged device.
Figure 6:
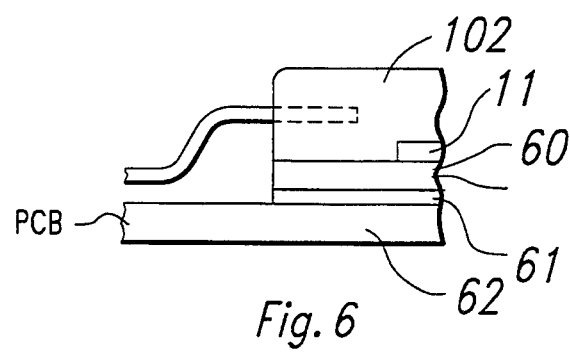
FIG. 6 represents an internal side view.
Figure 7A:
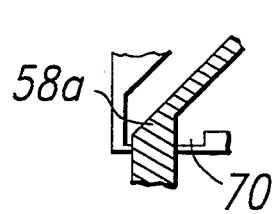
FIG. 7(a) to (d) represent alternative terminal arrangements for a packaged device.
Figure 7D:
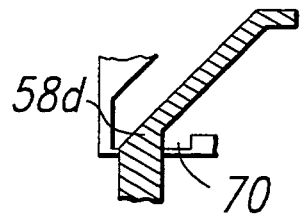
Figure 7B:
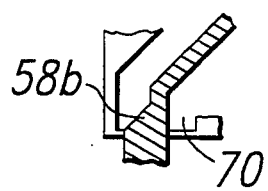
Figure 7C:
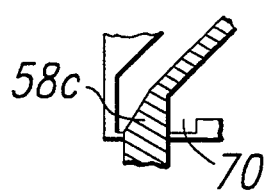

As may perhaps be more clearly seen from FIG. 6, which represents a cross sectional view of the packaged device of FIG. 5, wherein like reference numerals have been used to indicate like parts. A conductive heatsink 60 is provided which is maintained in thermal contact with semi-conductor die 11. Heatsink 60 has an external surface 61 which may be mated with regions of further heat capacity when the device is mounted for example, to a printed circuit board 62, for use in a circuit, heat being thereby removed from the die 11. In production, die 11 may be bonded to heatsink 60 by an adhesive with the additional properties of thermal conductivity and electrical conductivity, such as for example conductive epoxy. It is desirable for some circuit portions to be in electrical contact with the heatsink and indeed this may be achieved in production by conductively connecting certain terminal extensions directly to the heatsink, for example terminal extension 56 is preferably so connected at 57 (FIG. 5). The die preferably has a metalized lower surface in electrical and thermal contact with the grounded heatsink 60. Circuit nodes may thus be grounded by through hole connections thereto.

Rf circuits are typically designed with a characteristic impedance (Zo) of 50 ohms, that is that circuit blocks are matched one to another to present the characteristic impedance at interconnecting nodes. In prior art arrangements, matching at the point a packaged device was made part of a larger circuit was seldom achieved, and such arrangements are characterized by the presence of extra external components slugging such connection nodes to provide matching. With the present embodiment however, no such components are identifiable, and the reason for this will now be elaborated further.

Pins 17 and 18 (rfin, rfout) are terminals which in use carry rf signals and consequently must be at a matched node if there is to be circuit efficiency. In accordance with the present invention matching is achieved not through use of external components, but by virtue of the packaged device itself. Considering internal extension 58 of terminal 17, its characteristics are chosen such that it is matched as between the terminal 17 and rf device 11, that is it provides a signal path therebetween having characteristic impedance. In the present embodiment, this is achieved by ensuring the width of the extension in relation to its spacing from heatsink 60 acting as a ground plane so that extension and heatsink operate as a transmission line of characteristic impedance at the frequency of interest. In the present arrangement micro-strip design techniques were used. A portion 58A of constant width may be identified where the extension is maintained (by means of encapsulant, for example) a constant distance from ground plane heatsink 60; a portion of increased width exists outside the area of influence of the ground plane; a tapered portion of internal extension 58 connects the one to the other in a region where ground plane influence is diminishing. It will be apparent that similar considerations have been applied to rf output except multiple bond wires are applied yet to further reduce inductance. Any impedance mismatch is of such magnitude that it may be compensated within the device. Extension terminations are made close to the device 11 so providing a path which overall has substantially characteristic impedance.

Paying particular attention to intermediate region 58, a plurality of alternative arrangements (FIG. 7, $a$ to $d$) having differently profiled regions (58$a$ to 58$d$) cooperating with heatsink 60 are shown. Co-operating heatsink portion 70 will be particularly noted and serves to eliminate an area in which the conductor is widely spaced from the ground plane as would be the case with a conventional heatsink. Such extensions have the byproduct of providing stress relief at the interior/exterior boundary. It will also be noted that ground leads are preferably wide, providing low inductance, further providing shielding for the dc and rf connections, the latter being at the extremes of the pin array to maximize isolation therebetween. In use the rf pins would be connected by bringing 50 ohm lines up to the package.

A package may be realized with conductors of 18 mils width and 10 mils thickness spaced 20 mils from the heatsink ground plane in plastic. For many plastic encapsulants, it has been found that a width to height ratio of 1 yields a characteristic impedance of substantially 50 ohms. Wider conductors could be used if more mechanical strength is required (for successful manufacture for example) provided the resultant loss of bandwidth can be tolerated. In accordance with the present invention plastic packaged rf device may be realized with acceptable performance up to and in excess of 6 GHz.

In many applications, where a packaged device is pcb mounted, a ground plane board of thickness of between 30 and 40 mils of glass epoxy has proved effective. This limits application (and resultant insertion losses) due to conductor height over heatsink ground plane by reducing electrical discontinuity which would increase VSWR. If radiation affects neighboring devices, a shielding conductive lid may be used. A painted over package shield connecting ground pins may also suffice. Taking the package itself, pin to pin rf isolation is such that an integrated circuit GaAs heterojunction bipolar transistor amplifier may be encapsulated without risk of self-induced oscillation. This is true even if package grounding is significantly less than ideal.

Assume the two RF conductor end at the die are spaced 160 mils (4 mm) apart inside the package. Assume also that each conductor is terminated with a 50 ohm resistor and a 0.7 nH inductor to the package base ("ground"). If the package base is "true ground", then the isolation between RF conductors will be close to that shown in the first line of Table 1. However, let's assume that the package is connected to a phone chassis only with a screw, and that conductive epoxy is not used underneath the entire package base and PC board ground. Under these conditions there could be a finite path length to "true ground", resulting in a "common path" ground inductance. This means the 50 ohm terminations would be connected to ground through the same inductive path, which could range from 0.01 to 0.1 nH depending upon how the package is connected to ground.

However, with proper ground techniques (conductive epoxy or a ribbon connection along the PC board-to-package base edge) the common path ground inductance can be kept to 0.01 nH or less. An inductance of 0.01 nH would be equivalent to a 400 mil wide microstrip line (the package base, for instance), 2 mils above true ground (an air gap between the package and ground), and 60 mils long.

The effects of common path ground inductance on isolation between two 50 ohm terminated (with 0.7 nH series inductance) RF leads are shown in Table 1. Common path ground inductance has little effect on the input SWR of each lead, but acts as a (series) feedback path between the leads. Note that doubling the common path ground inductance reduces isolation between leads by 6 dB.

TABLE 1

Isolation Between Two 50-ohm Terminated RF Conductors versus
Common Ground Path Inductance
W = 30 mils, H = 40 mils, T = 20 mils, G = 160 mils
Termination = 50-ohms in series with 0.7 nH inductance (bond wires)

| COMMON PATH INDUCTANCE (nH) | ISOLATION dB at 1 GHz | ISOLATION dB at 10 GHz |
|---|---|---|
| 0.0 | 87 | 67 |
| 0.00125 | 81 | 63 |
| 0.0025 | 76 | 58 |
| 0.005 | 70 | 52 |
| 0.01 | 64 | 46 |
| 0.02 | 58 | 50 |
| 0.04 | 52 | 34 |
| 0.08 | 46 | 28 |
| 0.1 | 44 | 26 |

Exemplary package dimensions may be further appreciated from FIG. 6. The spacing between rf terminal extension connection sites may be about 200 mils, with the overall pin to pin electrical length being some 5.74 cm.

Another parameter which affects the impedance of a transmission line organized in this way is the nature of the surrounding di-electric, particularly that between conductors and ground plane; i.e. the encapsulant. The encapsulant may be varied along the length of the conductor as an alternative or in addition to control of conductor width/ground plane spacing. For example, encapsulant di-electric constant may be changed abruptly by interfacing encapsulant materials, or alternatively providing a region where material is graded from one region to another. A region of conductors in space void of encapsulant may also be employed. Typical dielectric constants for plastics (e.g. PLASKON 7060, HIPEC Q1-4939) are of the order of 3 or 4.

The above description has focused upon the microstrip nature of the transmission lines. It is envisaged, however, that other forms may be used, stripline for example. A two plate line, realized for example by placing ground planes above and below the conductor might have yet lower di-electric field discontinuities. A fully surrounded conductor, for example, a co-axial arrangement, would further improve this. Di-electric variation may also be applied to these alternatives. Transmission lines formed within a cavity is another alternative.

Figure 8:
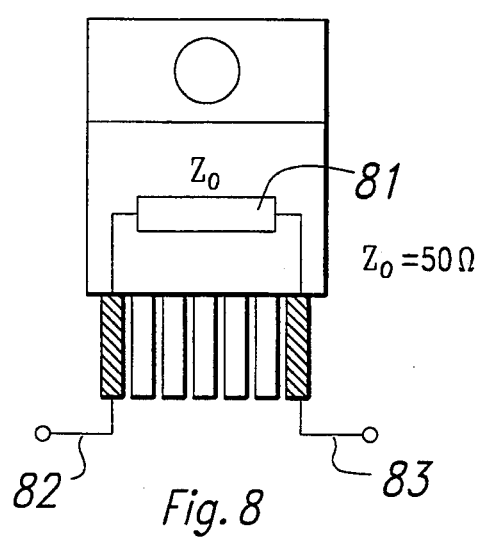
FIG. 8 shows a measurement arrangement.

In order to characterize the package thus far described, a section of 50 ohm transmission line (a thick film conductor, for example) may be configured inside a test package to test rf isolation, insertion loss, VSWR, etc. The test arrangement is shown diagrammatically in FIG. 8, wherein transmission line 81 may be seen between rf input 82 and rf output 83. Tests may be performed by mounting the package in a test fixture of known properties from which packaged device characteristics may be de-embedded. Typical results for loss and VSWR are listed in Table 2.

TABLE 2

THRU CHARACTERISTICS:

| FREQUENCY (GHz) | THRU LOSS (dB) | RETURN LOSS (dB) | VSWR |
|---|---|---|---|
| 0.5 | 0.10 | 36.5 | 1.03 |
| 0.75 | 0.13 | 31.9 | 1.06 |
| 1.0 | 0.17 | 27.5 | 1.09 |
| 1.5 | 0.25 | 21.0 | 1.20 |
| 1.75 | 0.30 | 19.2 | 1.24 |
| 2.0 | 0.33 | 18.4 | 1.27 |
| 2.5 | 0.37 | 21.3 | 1.18 |
| 3.0 | 0.52 | 17.7 | 1.30 |

Figure 9:
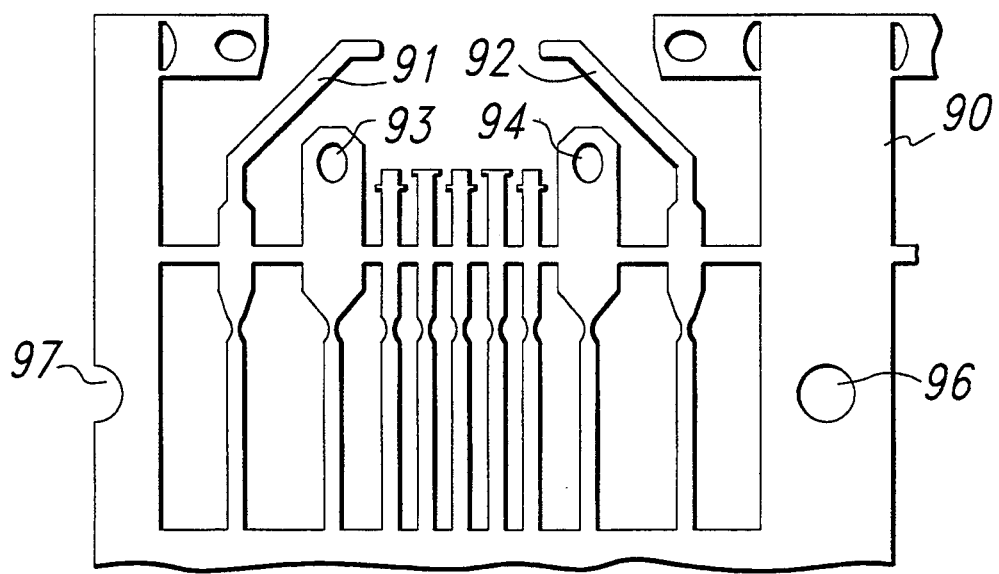
FIG. 9 represents a lead frame.

In a lead frame 90 suitable for realizing an rf packaged device in accordance with the present invention (FIG. 9), transmission line conductor terminal extensions 91, 92 may be observed in the form of lead frame fingers a plurality of such lead frames may be formed in a strip for ease of mechanization. The lead frame is designed in accordance with known principles to act as a carrier or support member during production, which might proceed as follows. Terminal extensions 91, 92 are configured with two 135° bends for mechanical strength so that lead thickness may be minimized, reducing radiation.

The lead frame 90 is preferably connected at sites 93, 94, 96, 97 to a metal heatsink to which an rf device has been bonded. Wire bonds are now put in place between the lead frame terminal extensions and the device. Since the eventual distance between terminal extension and heatsink is a key electrical parameter of the packaged device a jig may be put into place to support at least rf signal carrying conductors during bonding if the fingers are susceptible to deformation. Alternatively or in the case where deformation during subsequent encapsulation is a possibility a permanent spacer, for example in the form of an insulating tape may be applied. As a yet further alternative the conductor may be shimmed from the heatsink at a point or points along its length, for example with ceramic shims. This would be particularly appropriate where non parallel or non planar finger heatsink profiles are involved.

The device, heatsink and extension portions may now be encapsulated making use of the lead frame support. Finally, excess lead frame portions may be removed to leave terminals extending from the package.

From the foregoing it will be appreciated that the invention provides at least in one form thereof a rf packaged device in a plastic package utilizing lead frame assisted assembly that is electrically characterized for matching into a circuit, all this without recourse to the additional matching components or the bespoke rf packaging of the prior art, this important development has far reaching implications in terms of cost in that rf components may now be produced with the same materials and equipment as that which provides some of the lowest cost (non rf) packaged device types.

For example, if widespread cordless telephony is to be realized, the cost of the rf amplifiers necessary for portable units must be low. However, there is the apparently conflicting requirement of high efficiency. It will now be realized that the present invention provides opportunity for these requirements simultaneously to be met. A plastic packaged, 50 ohm characteristic, GaAs packaged amplifier may be realized that is not only susceptible to low cost production but is also efficient; since there is matching, insertion loss and input/output VSWR are low. Moreover, matching means that cost of, for example, a cordless telephone handset may be reduced. Not only is the need for matching components external to the amplifier removed (fewer components as well as increased efficiency) but the need for design procedures that have hereto been required to specify such components is also removed. Design activity may therefore be reduced to the level at which characteristic impedance is assumed; the need for expensive laboratory characterization and resultant rf matching being removed. Many types of rf components can be realized with the present invention. For example, an amplifier has been discussed above, however, other rf devices such as mixers are encompassed by the present invention.

The present invention encompasses a communication system, such as a cordless phone, incorporating a GaAs packaged device as described.

A preferred embodiment has been described in detail hereinabove. It is to be understood that the scope of the invention also comprehends embodiments different from those described, yet within the scope of the claims. Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A package for an rf device, said rf device having a characteristic impedance, said package comprising:
   a metal base which is at least partially exposed on a bottom side of said package prior to mounting said package;
   a leadframe attached to said metal base, said leadframe comprising rf leads for effecting circuit connections to said device wherein at least one of said connections is matched to said characteristic impedance by maintaining, along the length of said lead, the ratio between the spacing of said lead to said metal base and the width of said lead such that said lead and said metal base operate as a transmission line having said characteristic impedance;
   a plastic encapsulant over a portion of said metal base, said device, and a portion of said leadframe such that a portion of said metal base is exposed and said rf leads are partially exposed.

2. The package of claim 1, wherein said encapsulant is used to maintain said ratio.

3. The package of claim 2, wherein at least a portion of at least one of said connections runs in encapsulant void.

4. The package of claim 2, wherein the di-electric constant of said encapsulant varies along the length of at least one of said connections.

5. The package of claim 4, wherein said ratio varies with said dielectric constant.

6. The package of claim 1, wherein said metal base extends towards package extremity in the region where at least one of said rf leads exits said package.

7. The package of claim 6, wherein said at least one of said connections varies in width in said region.

8. The package of claim 1, wherein said metal base is a heatsink for said device.

9. The package of claim 1, wherein said metal base is a ground plane to said device.

10. The package of claim 9, wherein said ground plane and at least one of said connections combine to form overall package ground.

11. The package of claim 1, wherein said leads are adapted for surface mounting.

12. The package of claim 1, wherein at least one of said connections is terminated adjacent to said device.

13. The package of claim 1, wherein at least one of said connections includes a portion of multiple plate transmission line.

14. The package of claim 1, wherein at least a portion of at least one of said connections is pre-fabricated transmission line.

15. The package of claim 1, wherein at least one of said connections bends along its length to enhance mechanical strength thereof.

16. A packaged rf device, having a characteristic impedance, said packaged rf device comprising:
   an rf device;
   a metal base which is at least partially exposed on a bottom side of said package prior to mounting said packaged rf device;
   a leadframe attached to said metal base, said leadframe comprising rf leads for effecting circuit connections to said device wherein at least one of said connections is matched to said characteristic impedance by maintaining, along the length of said lead, the ratio between the spacing of said lead to said metal base and the width of said lead such that said lead and said metal base operate as a transmission line having said characteristic impedance;
   a plastic encapsulant over a portion of said metal base, said device, and a portion of said leadframe such that a portion of said metal base is exposed and said rf leads are partially exposed.

17. The packaged device of claim 16, wherein said device is an amplifier.

18. The packaged device of claim 17, wherein said amplifier includes GaAs heterojunction bipolar transistors.

19. The packaged device of claim 16, wherein said device is a portion of a communication system.

20. The packaged device of claim 16, wherein said device is a portion of a cordless phone.

* * * * *